US005539830A

United States Patent [19]

Park

[11] Patent Number: 5,539,830

[45] Date of Patent: Jul. 23, 1996

[54] MOUNTING STRUCTURE FOR AN INTEGRAL VIBRATION ELEMENT OF A SPRING TYPE ECHO MACHINE

[76] Inventor: Chong H. Park, 113-207, Sinsigaji Apt., Mok-dong, Yangcheon-ku, Seoul, Rep. of Korea

[21] Appl. No.: 325,882

[22] Filed: Oct. 19, 1994

[30] Foreign Application Priority Data

Dec. 17, 1993 [KR] Rep. of Korea ...................... 93-28215

[51] Int. Cl.[6] ........................................ H03G 3/00

[52] U.S. Cl. ........................ 381/64; 174/52.1; 174/138 G

[58] Field of Search ............................ 381/64; 174/52.1, 174/138 G

[56] References Cited

U.S. PATENT DOCUMENTS 4,322,702 3/1982 Bosch ...................................... 335/202

*Primary Examiner*—Forester W. Isen

*Attorney, Agent, or Firm*—Michael N. Meller

[57] ABSTRACT

A mounting structure for an integral vibration element to which a wire having a hook, a magnet, a cushion rubber ring and a vibration spring stopper are fitted, wherein the integral vibration element is inserted to a U-shaped boss and then the inserted portion of the integral vibration element is simply close up tight with a corresponding cover plate so that the assembling process may be separated and furthermore, since the working time required for the first process is decreased, mass production may be possible with the less number of workers.

2 Claims, 2 Drawing Sheets

MOUNTING STRUCTURE FOR AN INTEGRAL VIBRATION ELEMENT OF A SPRING TYPE ECHO MACHINE

BACKGROUND OF THE INVENTION

This invention relates to a mounting structure for a vibration element of a spring type echo machine. It particularly relates to a mounting structure for an integral vibration element of a spring type echo machine, which can divide the assembling process.

Generally, an echo machine has been used in mixer of an electric organ or a deluxe record player so to improve the acoustic properties. Although there are various kinds of echo machines, spring type echo machines are widely used because of the excellent echo and the lower cost.

Conventional structure of the 2-spring type echo machine is shown in FIG. 3 and FIG. 4. According to the structure, an input line (11) for input signal is connected to a flux producing input coil (12). An input core (13) propagated the flux produced in the input coil (12) is fixed in predetermined area of an insulator (15) in which the input coil (12) and vibration elements (14) are mounted via screwnails and washers. An output core (13') which is received the signal converted by the vibrations of magnets and springs (18) hooked from hooks (14*a*) of the vibration elements (14). An output coil (12') is arranged in the opposite insulator (15) and an output line (11') is connected to the output coil (12').

The magnet (14*b*) of the vibration element (14) installed in the insulator (15) is vibrated when the magnetic field of the input core (13) is changed according to the change of the impressed electric signal via the input line (11). Then the magnet (14*b*) of the output core (13') is vibrated by the vibration produced in the opposite vibration element (14) via the spring (18) so to generate the current signal from the output line (11') by the vibration of the magnet (14*b*) in opposite to the input signal. Wherein the output signal from the output line (11') contains echo signal.

The vibration element (14) comprises the wire (14*c*) having a hook (14*a*), the magnet (14*b*), a cushion rubber ring (14*d*) and a vibration spring stopper (14*e*). Said the vibration element is arranged in boss (15*e*) that is extruded in the opposite side of the spring (18). As shown in the FIG. 4, the magnet (14*b*) is fitted in the hook (14*a*) of the wire (14*c*) and fastened by means of adhesives. Then the cushion rubber ring (14*d*) is fixed into the wire (14*c*) and the cushion rubber ring (14*d*) fixed in the wire (14*c*) is closely contact to the second separating portion (15*b*). After the vibration spring stopper (14*e*) is inserted and closely fitted to the wire (14*c*) extruded to the fist separating portion (15*a*), the upper surface of the vibration spring stopper (14*e*) and the wire (14*c*) are soldered.

Consequently, each magnet (14*b*) is respectively arranged in the center of the boss (15*e*) via the cushion rubber ring(14*d*) and the vibration spring stopper (14*e*) so that the magnets (14*b*) are vibrated according to the changes of the corresponding magnetic fields.

In the foregoing structure, since the components of the vibration element (14) are arranged to the insulator in sequence, the working time required for the first process is increased so that mass production and division of the assembling process are difficult.

SUMMARY OF THE INVENTION

It is therefore an object of this invention to provide a mounting structure for an integral vibration element to which wire having a hook, a magnet, a cushion rubber ring and a vibration spring stopper are fitted, wherein the integral vibration element is inserted to a U-shaped boss and then the inserted portion of the integral vibration element is simply close up tight with a corresponding cover plate so that the assembling process may be separated. Furthermore, since the working time required for the first process is decreased, mass production may be possible with the less number of workers.

According to the invention, the integral vibration element comprising the wire having the hook, the cushion rubber ring and the vibration spring stopper, is inserted into the U-shaped boss of the insulator, and then the inserted portion of the integral vibration element is simply closed up tight with the corresponding cover plate.

In the present structure, the insulator comprises a bottom portion will be fixed to a bottom plate of the spring type echo machine, a core assembly mounting portion to which a coil and a core are arranged, the first separating portion to which a cushion rubber ring is closely contact, and the second and the third separating portion receiving the vibration spring stopper, wherein a U-shaped groove is formed in each upper portion of the first and the second separating portion. One part of the cover plate is fitted into a hole of the core assembly mounting portion, and the upper portion of the third separating portion is angled in a predetermined amount so that the other part of the cover plate may be easily inserted into the squared-shaped perforation formed in the upper portion of the third separating portion.

BRIEF DESCRIPTION OF THE DRAWINGS

The above and other objects and advantages of the invention will be apparent upon consideration of the following detailed description, taken in conjunction with the accompanying drawings, in which like reference numbers refer to like parts throughout, and in which.

DETAILED DESCRIPTION OF THE INVENTION

Figure 1:
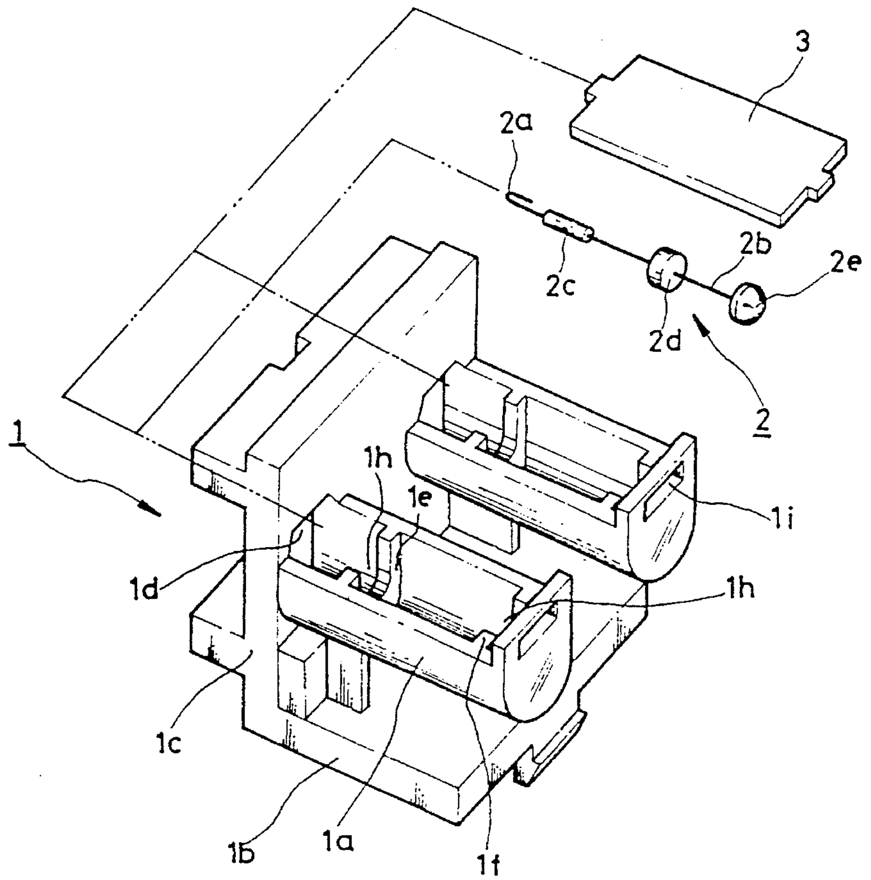
FIG. 1 is a separation view illustrating a mounting structure for an integral vibration element of a spring type echo machine.
Figure 2:
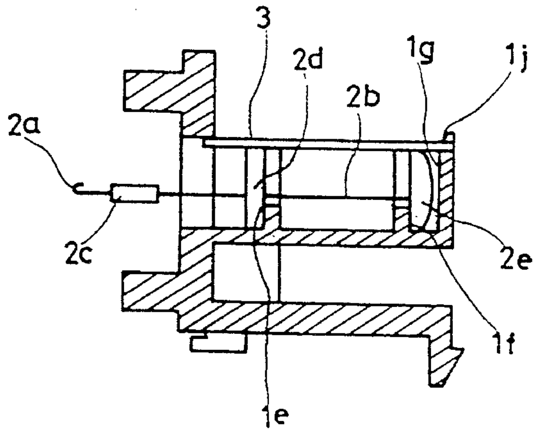
FIG. 2 is a section view showing the mounting state of the integral vibration element and an insulator.
Figure 3:
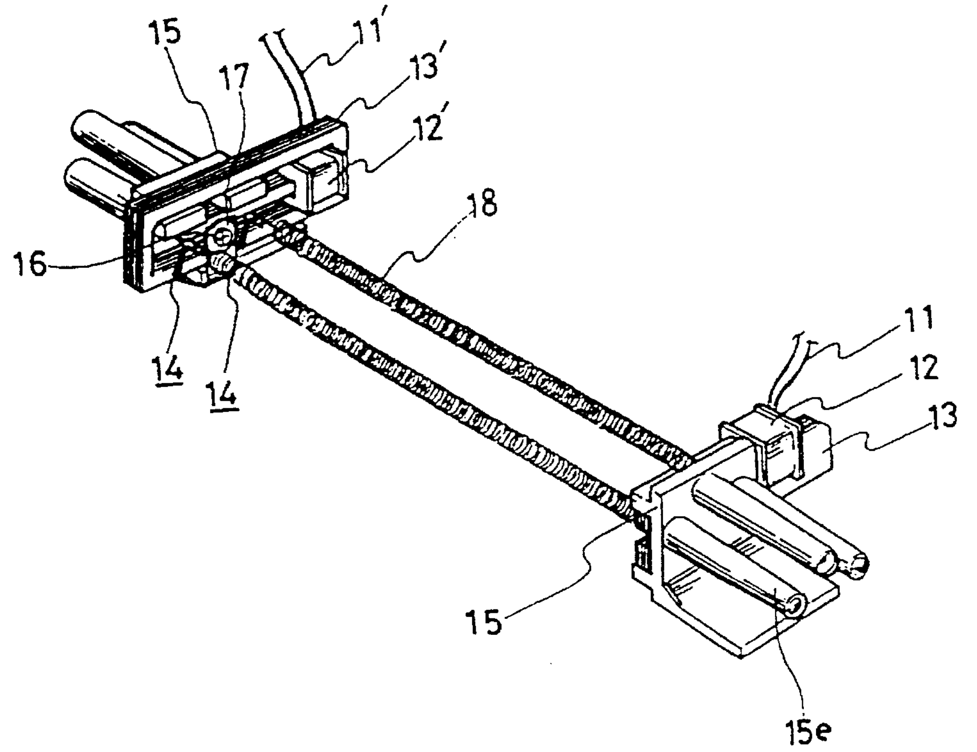
FIG. 3 is a perspective view of a spring type echo machine according to the prior art.
Figure 4:
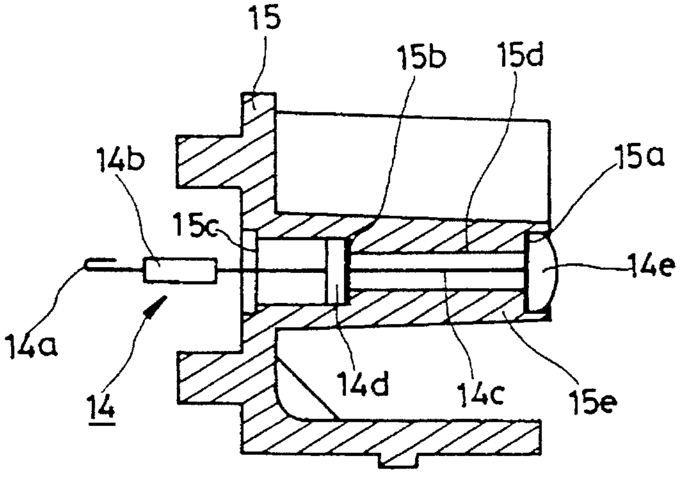
FIG.4 is a separation view showing the assembled state of the vibration element of the FIG. 3.

Referring to the drawing, FIG. 1 shows a mounting structure for an integral vibration element of a spring type echo machine, FIG. 2 shows the integral vibration element installed to an insulator, and FIG. 3 and FIG. 4 shows a prior art.

In the mounting structure according to an embodiment of the invention, the integral vibration element (2) comprising a wire (2*b*) having a hook (2*a*), a magnet (2*c*), a cushion rubber ring (2*d*) and a vibration spring stopper (2*e*) is inserted into a U-shaped boss (1*a*) formed in an insulator (1) and then the inserted portion of the integral vibration element (2) is simply closed up with a cover plate (3). The insulator (1) comprises a bottom member (1*b*) will be fixed to a bottom plate (not shown) of the spring type echo machine; a core assembly mounting portion (1*c*) to which an input coil (12) and an input core (13) connected to an input line (11), and an output coil (12') and an output core (13') connected to an output line (11') are installed; and the fist separating portion (1*e*) to which a cushion rubber ring (2*d*) is closely contact in the U-shaped boss communicated with a hole (1*d*) formed in the core assembly mounting portion, and the second separating portion (1*f*) and the third separating portion (1*g*) receiving a vibration spring stopper (2*e*). Wherein U-shaped grooves are respectively formed in upper portions of the first separating portion (1*e*) and the second separating portion (1*f*) and one part of a cover plate (3) is inserted into a hole (1*d*) of the core assembly mounting portion while an inclined surface (1*j*) is formed in the upper portion of the third separating portion (1*g*) so that the other part of the cover plate is easily inserted to a squared-shaped perforation (1*i*) formed in the third separating portion (1*g*).

Accordingly, a magnet (2*c*) arranged in the center of the U-shaped boss (1*a*) via the vibration spring stopper (2*e*) and the cushion rubber ring (2*d*) of the integral vibration element (2) hooked to the fist and the second separating portion (1*e*, 1*f*), is vibrated when the magnetic field of the core (13) is changed and at the same time, an opposite magnet (2*c*) is vibrated by a spring (1*f*) connected to a hook (2*a*) fixed in integral with the magnet (2*c*) so that the direction signal transferred from the output core (13') and output coil (12') is propagated to the output line (11').

In view of the foregoing, the present invention may separate the assembling process of the integral vibration element and the insulator so to reduce the working time required for the first process, and achieve mass production so to reduce the cost.

I claim:

1. A mounting structure for an integral vibration element comprising a wire having a hook, a magnet, a cushion rubber ring and a vibration spring stopper; wherein the integral vibration element is inserted into a U-shaped boss formed in an insulator and then the inserted portion of the integral vibration element is simply closed up with a cover plate.

2. A mounting structure according to the claim 1, the insulator comprises a bottom member adapted to be fixed to a bottom plate of a spring type echo machine; a core assembly mounting portion to which an input coil and an input core connected to an input line, and an output coil and an output core connected to an output line are installed; and a first separating portion to which a cushion rubber ring is closely contacted in the U-shaped boss and a second separating portion and a third separating portion receiving the vibration spring stopper; wherein U-shaped grooves are respectively formed in upper portions of the first separating portion and the second separating portion and one part of a cover plate is inserted into a hole in the core assembly mounting portion while an inclined surface is formed in the upper portion of the third separating portion so that the other part of the cover plate is easily inserted to a squared-shaped perforation formed in the third separating portion.

* * * * *